United States Patent [19]

Kawajiri et al.

[11] Patent Number: 4,714,950

[45] Date of Patent: Dec. 22, 1987

[54] SOLID-STATE PHOTO SENSOR DEVICE

[76] Inventors: Kazuhiro Kawajiri; Hiroshi Tamura; Haruji Shinada; Mitsuo Saito; Yuzo Mizobuchi, all c/o Fuji Photo Film Co., Ltd., No. 798, Miyanodai,, Kaisei-machi, Ashigarakami-gun Kanagawa, Japan

[21] Appl. No.: 749,400

[22] Filed: Jun. 27, 1985

[30] Foreign Application Priority Data

Jul. 4, 1984 [JP] Japan .................................. 59-137333

[51] Int. Cl.⁴ ........................ H01L 27/14; H01L 31/00
[52] U.S. Cl. ......................................... 357/30; 357/24; 357/2; 357/16; 357/58
[58] Field of Search ................. 357/30, 24 LR, 2, 58, 357/16, 63, 30 K, 30 F, 31, 24

[56] References Cited

U.S. PATENT DOCUMENTS 4,236,829 12/1980 Chikamura et al. .................. 357/24
4,271,420 6/1981 Chikamura et al. ............ 357/24 LR

FOREIGN PATENT DOCUMENTS 0039569 3/1982 Japan ...................................... 357/30
0042174 3/1982 Japan ...................................... 357/30

Primary Examiner—James W. Davie
Assistant Examiner—Georgia Y. Epps
Attorney, Agent, or Firm—Birch, Stewart, Kolasch and Birch

[57] ABSTRACT

A solid-state photo sensor device includes a first electrode layer for allowing light to pass therethrough, a first amorphous silicon layer of one conductivity type formed below the first electrode layer, a second amorphous silicon layer of a conductivity type, other than the one conductivity type, disposed below the first amorphous silicon layer, and an output circuit for delivering in the form of an electric current photocarriers excited at least in the second amorphous silicon layer. The first and second amorphous silicon layers each contain inpurity elements whose concentration ranges from about 0 molPPM to 200 molPPM. The output circuit delivers as an electric current also photocarriers excited in the first amorphous silicon layer.

19 Claims, 14 Drawing Figures

FIG. 2
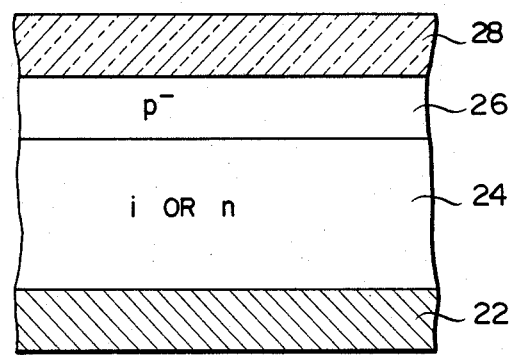
FIG. 3A    FIG. 3B
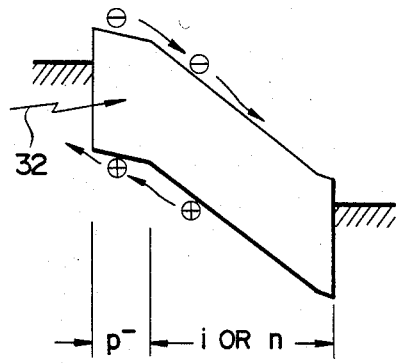 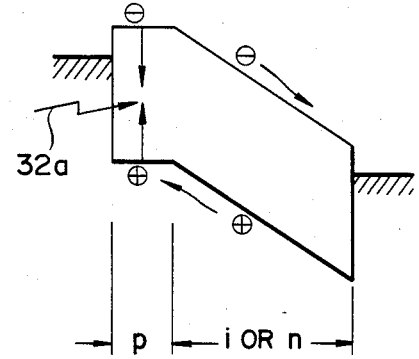

$B_2H_6/SiH_4$ DENSITY (MOL PPM)
(p: 200Å, n: 3μm)

SOLID-STATE PHOTO SENSOR DEVICE

BACKGROUND OF THE INVENTION

1. Field of the Invention

The present invention relates to a solid-state photo sensor device, and more particularly, to a solid-state photo sensor comprising a first electrode layer that is transparent for passing light therethrough, a first amorphous silicon layer of a first conductivity type formed below the first electrode layer, a second amorphous silicon layer of a conductivity type, other than the first conductivity type, formed below the first amorphous silicon layer, and output means for photocarriers, in the form of an electric current, excited at least in the second amorphous silicon layer.

2. Description of the Prior Art

Since a solid-state optical sensor device constructed in so-called two-layer photosensitive configuration with the first and second amorphous silicon layers has a relatively larger, effective optical opening and a relatively higher quantum efficiency, it is effectively applied to various apparatus such as a solid-state image pickup device having a one- or two-dimensional photosensitive array, a solar battery, and a photosensitive element for electronic photography.

Amorphous silicon does not include a periodic lattice or array of atoms, and is thus different in physical characteristics from the crystalline silicon constructed with a periodic array of atoms having a longer period. A prior art material using amorphous silicon has only quite unfavorable photoelectric characteristics because of structural defects due to the absence of a periodic atom array.

It has been found, however, that amorphous silicon containing a guest element or elements, for example, hydrogen and/or fluorine atoms, which lower the localized levels of electrons and holes existing in the energy band gap of the amorphous silicon, develops a higher photoelectric conductivity with a relatively higher resistivity ($10^8$–$10^9 \Omega$cm). In addition, like the crystalline silicon, the electric conductivity of such amorphous silicon becomes controllable by doping impurities. See, for example, "Solid State Communication", vol. 17, p. 1193 (1975); W. E. Spear and P. G. Le Comber. For example, as described in "Applied Physics Letters", vol. 28, page 671 and subsequent pages, 1976; D. E. Carlson and C. R. Wronski, the amorphous silicon has been regarded as means applicable to the fundamental and applied fields, and especially, its application to an optical electromotive force device has attracted attention of those who are concerned.

The amorphous materials utilized in accordance with the present invention are not limited to the amorphous silicon materials containing elements such as hydrogen, but may include a material obtained by replacing a portion of an amorphous silicon material containing, for example, hydrogen with a congener to silicon such as carbon, and a material in which impurity elements such as oxygen and nitrogen are contained in the silicon material. These materials will be collectively referred to as amorphous silicon hereinbelow.

For example, when producing an amorphous silicon material having a high resistance of about $10^{12}\Omega$cm, which is required for a photosensitive layer allowing a low dark current, if the temperature of the substrate on which the amorphous silicon layer is formed by use of a glow discharge in silane is set lower than about 200° C., the resultant amorphous silicon layer has a quite deteriorated photoelectric conductivity. Particularly, the sensitivity has been found to decrease in a low electric field. This phenomenon is considered to be caused by a great number of lattice defects in the layer.

In addition, it is well known to mix a small amount of methane in the silane to increase the dark resistance at glow discharge thereby manufacturing an amorphous material in which a portion of the silicon is replaced with carbon, which is a congener to silicon. It has also been found that the photoelectric conductivity is decreased when increasing the dark resistance by this method as well.

On the other hand, if the temperature of the substrate described above is set higher than approximately 200° C. to obtain a higher photoelectric conductivity, the resultant amorphous layer develops a resistivity of only about $10^8$ to $10^{12}\Omega$cm, and the obtained solid-state image pickup device is deteriorated in signal-to-noise (S/N) ratio due to the remarkable dark current. Consequently, requirements for a higher dark resistance and a higher photoelectric conductivity in manufacturing an amorphous silicon material are inconsistent to each other. When the former requirement is satisfied, the latter is deteriorated, and vice versa, that is, it has been quite difficult to satisfy both of these requirements at the same time.

Since the dark resistance of an amorphous silicon material having a favorable high photoelectric conductivity could not be set to $10^{12}\Omega$cm or more so far as the abovementioned method is used, the inventors attempted to compensate for this disadvantage with a pn junction, referred to as including an np junction, that is formed by disposing a p-type layer for blocking electrons on the surface of the amorphous silicon layer created in advance into which surface electrons are injected; moreover, a pin junction, referred to as including an nip junction, is formed by disposing an n-type layer for blocking holes, an intrinsic layer, and a p-type layer for blocking electrons, thereby realizing a higher dark resistance required for a photosensitive device by use of a depletion layer produced by inversely applying a bias current thereto, Japanese Patent Laid-Open Publication No. 42174/1982.

However, a two-layer configuration photo sensor device composed of such prior art amorphous silicon materials could not accomplish a favorable, optical spectral sensitivity with a sufficiently low dark current. In the prior art device, the first amorphous silicon layer is 50 to 200 angstroms (Å) thick and the impurity concentration is 500 to $10^4$ molPPM. The second amorphous silicon layer is substantially intrinsic.

Since the amorphous silicon material has a relatively lower resistivity, a sufficient electric field is not produced in the first amorphous silicon layer, and hence the depletion layer is not formed. Consequently, photocarriers excited by the light entered the first amorphous silicon layer are immediately recombined so to not be effectively sensed in the form of photocurrent. As is well known, light having a relatively shorter wavelength is absorbed in the portion shallower from the surface of the silicon material, that is, there has been a disadvantage that a favorable shorter wavelength sensitivity cannot be obtained due to photocarrier recombination in the shallower portion from the surface.

Accordingly, it is desired to implement a solid-state photo sensor device which develops a favorable spectral sensitivity and an improved S/N ratio with a low dark current with the advantageous characteristics of the amorphous silicon utilized.

SUMMARY OF THE INVENTION

It is therefore an object of the present invention to provide a solid-state photo sensor device which develops a desirable S/N ratio with a low dark current and which has a favorable spectral sensitivity characteristic for satisfying the above-stated requirements.

In a solid-state photo sensor device of the present invention, the first and second amorphous silicon layers each contain impurity elements of about 0 molPPM to 200 molPPM, and the output means also delivers photocarriers, in the form of electric current, excited in the first amorphous silicon layer.

BRIEF DESCRIPTION OF THE DRAWINGS

The objects and features of the present invention will become more apparent from consideration of the following detailed description taken in conjunction with the accompanying drawings in which:

FIG. 2 is a cross-sectional diagram depicting in a magnified scale a portion of the structure of FIG. 1;

FIG. 3A is an energy band diagram conceptually demonstrating the energy band state in the structure of FIG. 2;

FIG. 3B is an energy band diagram of a device constructed by the conventional technology in comparison to FIG. 2;

DESCRIPTION OF THE PREFERRED EMBODIMENTS

Embodiments of the solid-state photo sensor device will be described in detail by referring to the accompanying drawings.

Figure 1:
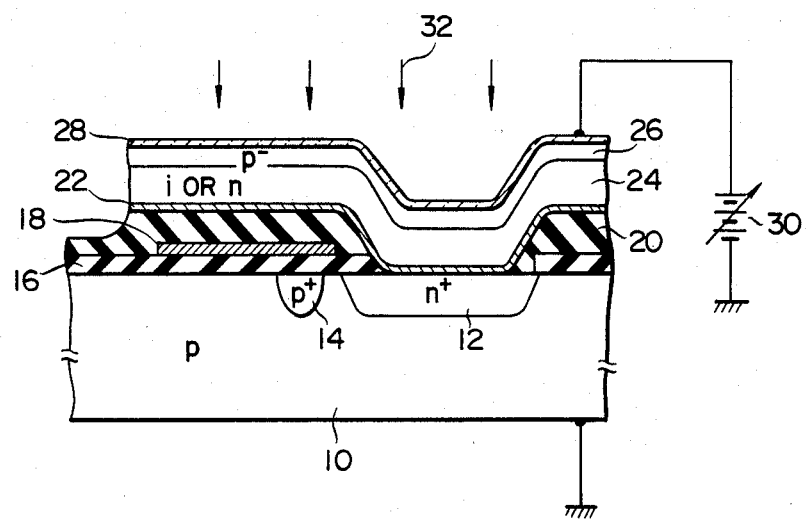
FIG. 1 is a cross-sectional diagram conceptually illustrating an embodiment of the solid-state photo sensor device in accordance with the present invention.

FIG. 1 illustrates a cross-sectional diagram of an embodiment of the solid-state photo sensor device according to the present invention. Although only a single photosensitive cell is shown here, an image pickup array may be configured by arranging a plurality of such photosensitive cells in a one- or two-dimensional structure.

In the structure of the cell of FIG. 1, an n+ region 12 is formed in a p-type silicon substrate 10 so as to function as a pn diode therebetween. On the substrate structure, there is formed a silicon oxide layer 16, on a portion of which a gate electrode 18 is disposed. The oxide layer 16 below the gate electrode 18 functions therefore as a gate insulation layer of the CCD or MOS structure. A p+ layer 14 formed on the substrate 10 functions as a potential barrier with respect to the photocarriers collected in the n+ layer 12. These elements function as a current readout mechanism by use of the photocarriers in the n+ layer 12.

On the structure described above, there is formed an insulation layer 20 having an opening over the n+ region, which is covered by an electrode layer 22. In this embodiment, two amorphous silicon layers 24 and 26 are formed on the electrode layer 22 and covered with a transparent electrode layer 28 as the upper-most layer. The amorphous silicon layer 26 of this embodiment is slightly or shallowly doped to be of one conductivity type, for example, p-($\pi$) type as shown in FIG. 2, and the amorphous silicon layer 24 therebelow is substantially intrinsic (i) or of the other conductivity type, that is, n type. A bias voltage 30 is applied to the transparent electrode layer 28 with respect to the substrate 10, and the amorphous silicon layers 24 and 26 form a photosensitive region for generating photocarriers in response to an incident light 32. The configurations of these amorphous silicon layers 24 and 26 will be described later in this specification.

Naturally, n-type silicon may be adopted as the substrate 10. In this case, the upper amorphous silicon layer 26 is of the n−($\nu$) type and the lower amorphous silicon layer 24 is substantially intrinsic (i) or of the p-type.

In this embodiment, the magnitude of impurity concentration of the amorphous silicon layer 24 is more than one order of magnitude below that of the prior art layer described above, which allows the optical spectral sensitivity characteristic to be improved. In addition, the instrument manufacturing the device is less contaminated by the impurity gas because of the low impurity concentration; therefore, the reproducibility of devices is advantageously improved.

For example, when the amorphous silicon layer 26 is of the p− type and the amorphous silicon layer 24 is intrinsic (i) or of the n-type as shown in FIG. 2, the energy band structure is represented as shown in FIG. 3A, which conceptually illustrates the energy band state of FIG. 2 in the depth direction thereof, that is, a potential slope is formed also in the p− layer 26. This is because the electric field is applied to the p− layer 26 which has a lower impurity concentration and thus a relatively higher resistivity.

Consequently, part of the incident light 32 absorbed in the portion of the device structure nearer to the transparent electrode 28, that is, the light mainly having a shorter wavelength excites photocarrier pairs, which travel in the opposite directions from each other due to the potential slope, and is recombined at relatively lower probability. This means that the light having such a shorter wavelength can also contribute to the generation of effective photocurrent, like the light having a relatively longer wavelength which reaches the amorphous silicon layer 24 to generate photocarriers therein. As described hereinabove, the photosensitive device of the present invention develops an improved spectral characteristic with respect to the shorter wavelength.

For reference, since the amorphous silicon layer of the prior art structure shown in FIG. 3B in comparison to the amorphous silicon layer 26 of this embodiment is relatively deeply doped and thus has a lower resistivity, an electric field is barely formed therein. Consequently, even if photocarrier pairs are generated by an incident light 32a, they are recombined without flowing through the layer. The carrier pairs thus do not contribute to the photocurrent generation.

Figure 4:
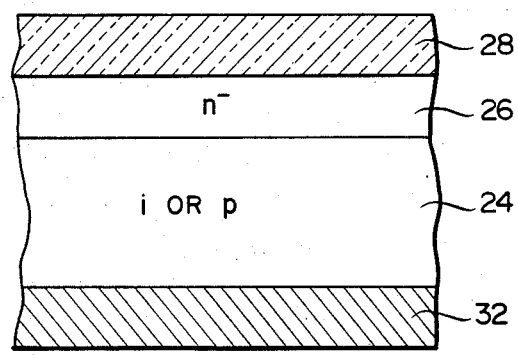
FIG. 4 is a cross-sectional diagram depicting another embodiment in accordance with the present invention.
Figure 5A:
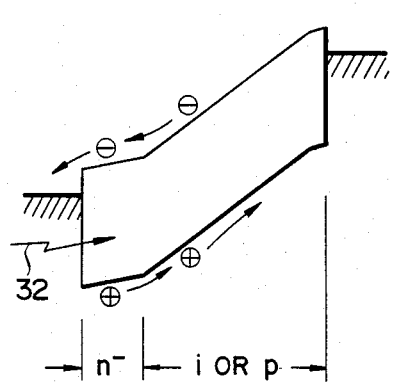
FIG. 5A is an energy band diagram conceptually showing the energy band state of the structure of FIG. 4.
Figure 5B:
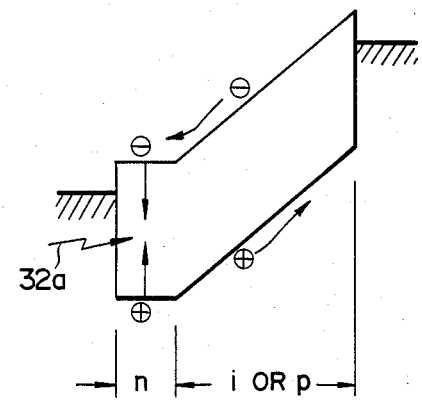
FIG. 5B is an energy band diagram of a device constructed by the conventional technology in comparison to FIG. 4.

As illustrated in FIG. 4, this is also the case when the amorphous silicon layer 26 is of the n− type and the amorphous silicon layer 24 is intrinsic (i) or of the p-type. The energy band construction in this case is as depicted in FIG. 5A. FIG. 5B illustrates the band energy structure of the comparative prior art device, namely, the layer comparative to the amorphous silicon layer 26 of this embodiment is of the n-type.

In general, an amorphous silicon material not doped is of the n-type due to its structural defects, and addition of an impurity thereto will change its carrier mobility in the material. Addition of a p-type impurity causes the electron mobility to be decreased. When the impurity concentration exceeds approximately 100 molPPM, the electron mobility is reduced to be $10^{-7}$ m$^2$/V.sec to $10^{-9}$ m$^2$/V.sec or below.

If the impurity concentration of the p layer exceeds about 200 molPPM in a pn junction, the thickness of the depletion region in the p layer is lowered to be at most 100 Å when the applied voltage is one volt. In an ordinary pn junction, therefore, the depth of the p layer contributing to the formation of the junction is about 100 Å to 200 Å, and the thickness of the depletion region in the p layer is at most about 10 Å when the impurity concentration is about 1,000 molPPM to 10,000 molPPM.

The diffusion coefficient of carriers in an amorphous silicon material is small, so that generated photocarriers are almost entirely recombined in a region subjected to a weak electric field as described before. Consequently, the light entering from the p layer to the pn junction formed in accordance with the prior art impurity concentrations does not contribute to the photocurrent generation, that is, ineffective for creating the photocurrent.

However, if the impurity concentration is at most 200 molPPM as shown in this embodiment, the depletion region is elongated in the p layer, hence photocarriers generated in the p layer are separated by an electric field formed in the depletion layer to be effectively obtained in the form of the photocurrent.

In general, when trivalent atoms, for example, boron atoms are added to an amorphous silicon layer, the energy band gap thereof is decreased, and hence the light transmittivity of this layer is reduced as functioning as a p layer. In order to overcome this difficulty, the relationships between the concentration of boron atoms in the p layer forming a pn junction in an amorphous silicon material and the rectification characteristic of the pn junction have been precisely studied, which leads to the following fact. Even where the concentration of B$_2$H$_6$ gas comprising a p-type impurity element, boron, is set to about 10 molPPM in the silane gas, SiH$_4$, when producing the p layer, the resultant pn junction develops a favorable rectification characteristic. In addition, a higher S/N ratio has been obtained between the photocurrent and the dark current with a reverse voltage applied. The spectral sensitivity has been increased as the boron concentration is decreased.

Figure 6:
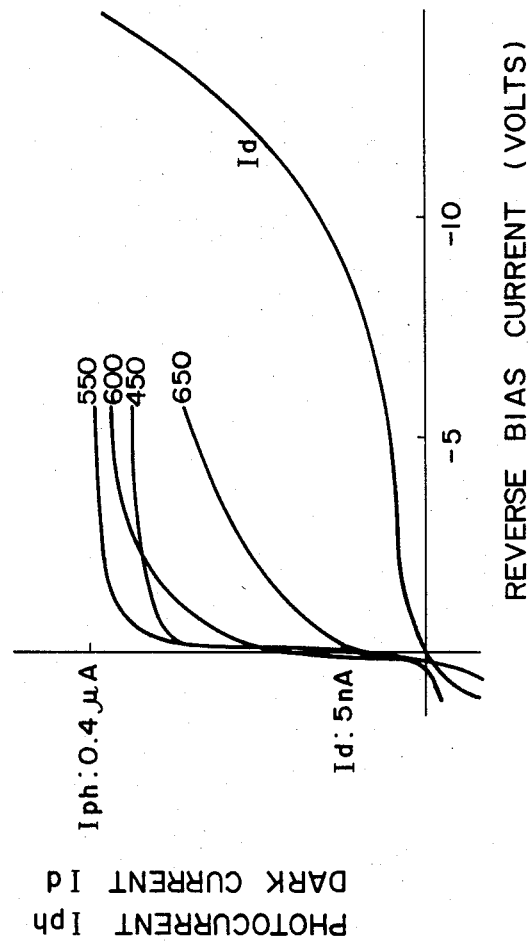
FIG. 6 to FIG. 12 are graphs plotting examples of experimental results of various embodiments in accordance with the present invention.
Figure 7:
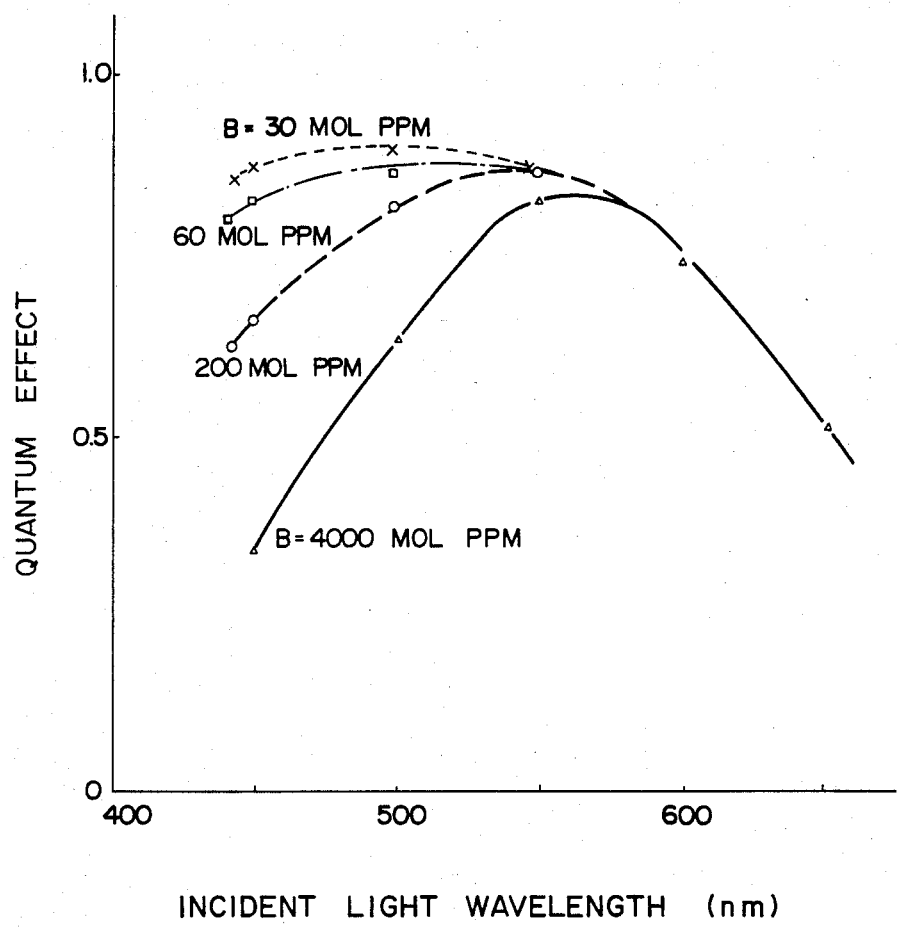

For example, FIG. 6 depicts the reverse bias to current characteristic of a pn junction formed with a p layer of 200 Å thick, which is doped with 60 molPPM boron atom therein, and an n layer which is 2 μm thick. The figures associated with the respective curves indicate the wavelengths of the incident light in nanometers (this is also the case for the subsequent graphs). As can be seen from this graph, a sufficient photocurrent Iph also flows in the shorter-wavelength range. FIG. 7 depicts the relationships between the quantum efficiency and the incident light wavelength for several samples in the parameters of the boron concentration. Clearly, the quantum efficiency is improved in the shorter-wavelength range as the doping impurity concentration is lowered.

Figure 8:
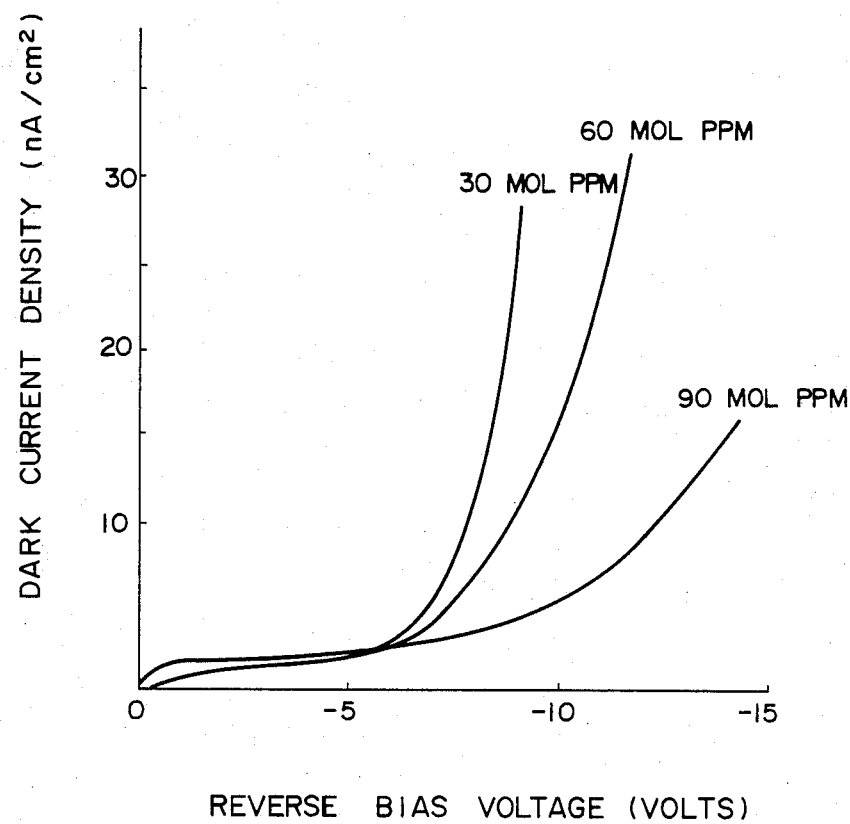

Returning to FIG. 6, it reveals that a sufficient S/N ratio has been obtained to the dark current Id with the sample. FIG. 8 plots the relationships between the reverse bias and the dark current density measured on three samples. As can be seen from this graph, the dark current rises up when the reverse bias voltage ranges about seven to nine volts.

Figure 9:
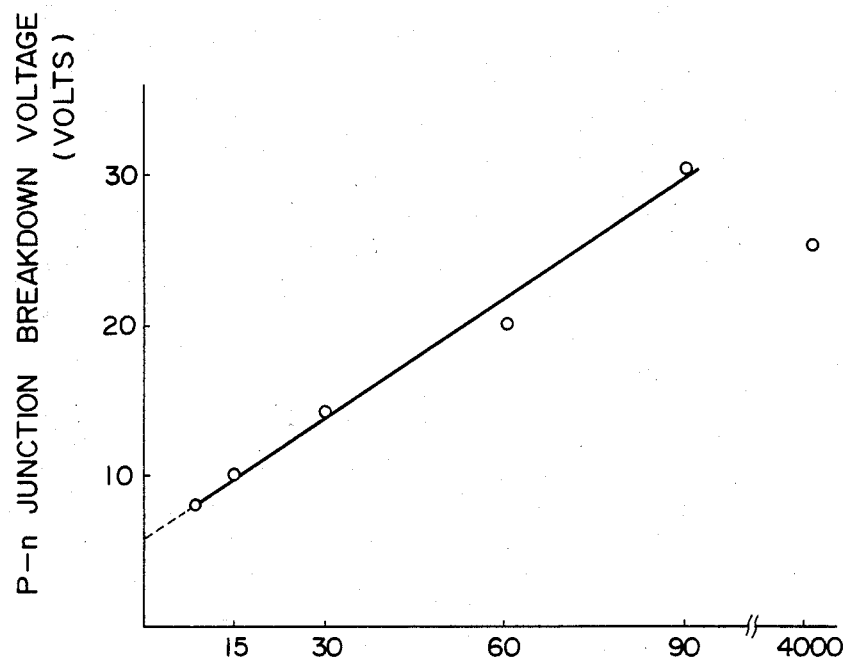

As illustrated in FIG. 9, which is a graph showing the relationships between the B$_2$H$_6$/SiH$_4$ ratio and the pn junction breakdown voltage measured on a sample comprising a pn junction formed with a 200 Å thick p layer and a 3 μm thick n layer, a favorable breakdown value is obtained in the concentration range depicted in this graph. A case in which the concentration is 4,000 molPPM is also plotted for comparison.

Figure 10:
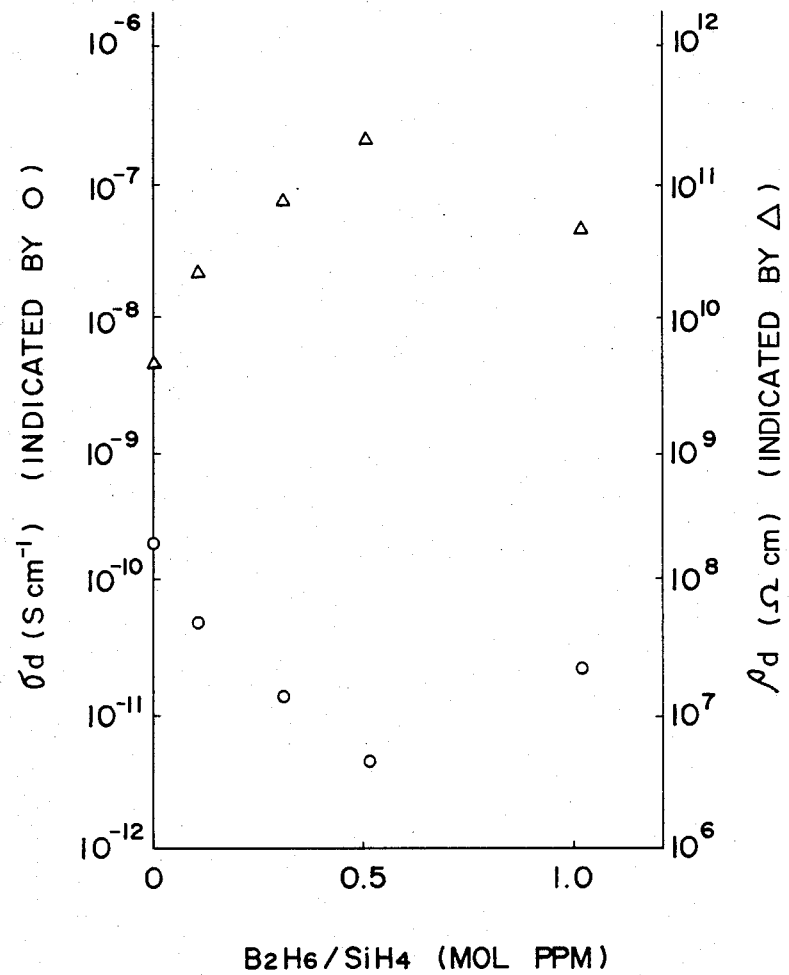

FIG. 10 depicts the conductivity σd and resistivity ρd of the same samples measured in the dark state. As can be seen from this graph, a resistivity of about $10^{11}$Ω.cm is obtained.

Figure 12:
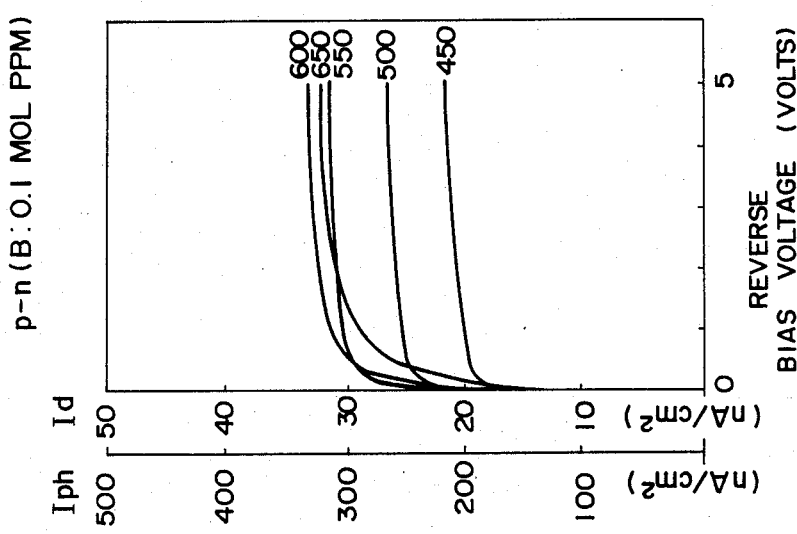
Figure 11:
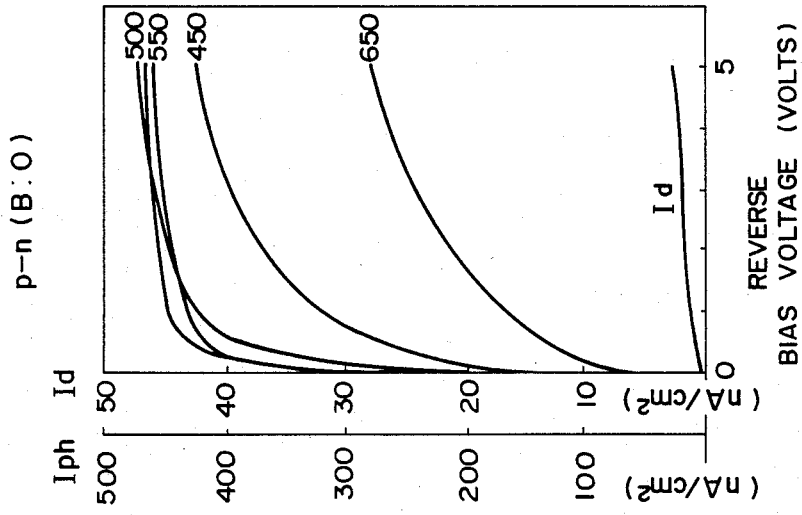

FIGS. 11 and 12 are graphs illustrating the spectral characteristics of the photocurrent density Iph and dark current density Id with respect to the reverse bias applied to the pn junction for samples whose boron atom concentration is 0 to 0.1 molPPM, respectively. The figures associated with the curves represent the respective wavelengths of the incident light. It is found from these graphs that a sufficient photocurrent sensitivity is obtained also in the shorter wavelength range and that a favorable S/N ratio is developed for the dark current.

In accordance with the present invention as described hereinabove, the amorphous silicon layer 26 contains impurity elements of the concentration ranging from about 0 to 200 molPPM. Considering the breakdown voltage developed as a pn diode, an impurity concentration at least 1 molPPM is desirable. The maximum value is approximately 200 molPPM and the favorable value is at most about 90 molPPM. The optimal value is in a range from 10 to 60 molPPM.

For a p-type layer, trivalent elements such as boron (B), aluminum (Al), and galium (Ga) are advantageously utilized as the impurity elements. For an n-type layer, quinquevalent elements such as nitrogen (N), phosphorus (P), arsenic (As), antimony (Sb) and bismuth (Bi) are advantageously adopted as the impurity elements. The thickness of the amorphous silicon layer 26 in the direction perpendicular to the principal surface of the substrate 10 should be advantageously set to be less than that of the amorphous silicon layer 24 disposed therebelow, and is favorably about 50 to 1,000 Å.

The amorphous silicon layer 24 may be formed with an intrinsic amorphous silicon material which does not substantially contain the impurity (favorably, the impurity concentration is at most 0.5 molPPM), or a compensation-type intrinsic silicon material which is doped with donor and acceptor impurity elements so as to be compensated with each other. Alternatively, it may also be the other conductivity type silicon material which favorably contains impurity elements at most about 1 molPPM and not exceeding 0.5 molPPM. As the impurity elements, quinquevalent elements such as N, P, Sb, and As, or trivalent elements such as B, Al, and Ga are advantageously utilized. It is advantageous to select the thickness of the amorphous silicon layer 24 in the direction perpendicular to the principal surface of the substrate 10 in the range of about 0.1 to 5 μm.

These amorphous silicon layers 24 and/or 26 may contain hydrogen or fluorine (F). Such a layer is advantageously produced by sputtering silicon in an inert gas atmosphere containing hydrogen or fluorine. Or, it may be manufactured by use of a glow discharge in a silicon compound gas, for example, $Si_nH_{2n+2}$ (n=1, 2, 3) and $Si_nH_{2n+2}\text{-}mH_m$.

In the structure shown in FIG. 2, it is advantageous to set the impurity concentration and the thickness of the p-type amorphous silicon layer 26 to about 1 to 100 molPPM and approximately 50 to 1,000 Å, respectively. In this case, the impurity concentration of trivalent elements and the thickness of the amorphous silicon layer 24 are advantageously selected to be at most 1 molPPM and about 0.1 to 5 μm, respectively. Or, it may contain hexavalent impurity elements whose concentration is about 0 to 1 molPPM and may be about 0.1 to 5 μm thick.

In the structure shown in FIG. 4, the concentration of trivalent or hexavalent impurity elements are at most about 200 molPPM with a preferable range of 0 to 10 molPPM. The most advantageous concentration of inpurities and thickness of the n-type amorphous silicon layer 26 are set to at most about 0.1 molPPM and about 50 to 1,000 Å. In this case, the concentration of trivalent impurity elements and the thickness of the amorphous silicon layer 24 are advantageously selected to be about 0.1 to 100 molPPM and about 0.1 to 5 μm, respectively.

Although the present invention can be advantageously applied to a solid-state image pickup device constructed in a one- or two-dimensional photosensitive cell array, it is also advantageously applicable to other instruments which are not configured in a cell structure, for example, a photo sensor device comprising a single photosensitive cell or a photosensitive layer to be utilized in an image pickup tube.

In accordance with the present invention as described hereinabove, the amorphous silicon layer disposed in the vicinity of the light receiving surface has a lower impurity concentration so as to allow a depletion layer to be formed therein. Consequently, photocarriers excited in this layer can also be extracted as a photocurrent. As a result, a favorable spectral sensitivity characteristic is obtained, thereby realizing a solid-state photo sensor device which develops a higher S/N ratio with a smaller dark current.

While the present invention has been described with reference to the particular illustrative embodiments, it is not restricted by those embodiments but only by the appended claims. It is to be appreciated that those skilled in the art can change or modify the embodiments without departing from the scope and spirit of the present invention.

What is claimed is:

1. A solid-state photo sensor device comprising:
a first electrode layer for allowing light to pass therethrough;
a first amorphous silicon layer of a first conductivity type disposed below said first electrode layer;
a second amorphous silicon layer of a second conductivity type, other than the first conductivity type, disposed below said first amorphous silicon layer;
said first and second amorphous silicon layers each containing impurity elements whose concentration ranges from about 0 molPPM to 200 molPPM;
said second amorphous silicon layer being disposed on a second electrode layer;
said second electrode layer overlying a first insulating layer except in an area where said second electrode layer is electrically connected to a first type impurity region, said first type impurity region being disposed in a substrate and forming a p-n diode with said substrate;
a gate insulation layer overlying said substrate, except in said area where said second electrode layer is electrically connected to said first type impurity region;
a gate electrode being disposed between said gate insulation layer and said first insulation layer; and
a potential barrier region of a second type impurity being disposed in said substrate, separate from said first type impurity region,
wherein the device delivers photocarriers in the form of an electric current, excited at least in said second amorphous silicon layer,
and wherein the device also delivers photocarriers, in the form of an electric current, that are excited in said first amorphous silicon layer.

2. The solid-state photo sensor device according to claim 1, wherein the thickness of said first amorphous silicon layer in the direction perpendicular to a principal surface thereof is less than that of said second amorphous silicon layer.

3. The solid-state photo sensor device according to claim 2, wherein the thickness of the first amorphous silicon layer in the direction perpendicular to the principal surface thereof is about 50 to 1,000 Å.

4. The solid-state photo sensor device according to claim 2, wherein the thickness of said second amorphous silicon layer in the direction perpendicular to the principal surface thereof is about 0.1 to 5 μm.

5. The solid-state photo sensor device according to claim 1, wherein said first amorphous silicon layer is a p-type layer containing impurity atoms of an element selected from the group consisting of B, Al, Ga, and In.

6. The solid-state photo sensor device according to claim 1, wherein said first amorphous layer is an n-type layer containing about 200 molPPM of quinquevalent atoms of an element selected from the group consisting of N, P, As, Sb, and Bi.

7. The solid-state photo sensor device according to claim 1, wherein the second amorphous silicon layer contains substantially no impurity atoms.

8. The solid-state photo sensor device according to claim 7, wherein said second amorphous silicon layer contains impurity atoms whose concentration is at most about 1 molPPM.

9. The solid-state photo sensor device according to claim 7, wherein the second amorphous silicon layer contains impurity atoms whose concentration is at most about 0.1 molPPM.

10. The solid-state photo sensor device according to claim 1, wherein at least one of said first and second amorphous silicon layers contains elements selected from the group consisting of hydrogen and fluorine.

11. The solid-state photo sensor device according to claim 10, wherein said first and second amorphous silicon layers are each formed by sputtering silicon in an inert gas atmosphere containing elements selected from the group consisting of hydrogen and fluorine.

12. The solid-state photo sensor device according to claim 1, wherein said first and second amorphous layers are each formed by use of a glow discharge in a silicon compound gas.

13. The solid-state photo sensor device according to claim 1, wherein said first amorphous layer is a p-type layer whose impurity concentration is about 1 to 200 molPPM, and said p-type layer having a thickness of about 50 to 1,000 Å.

14. The solid-state photo sensor device according to claim 8, wherein said second amorphous silicon layer contains trivalent impurity atoms whose concentration is at most about 1 molPPM, said second amorphous silicon layer having a thickness of about 0.1 to 5 μm.

15. The solid-state photo sensor device according to claim 8, wherein the first amorphous silicon layer contains hexavalent impurity atoms whose concentration is about 0 to 10 molPPM, said first amorphous silicon layer having a thickness of about 0.1 to 5 μm.

16. The solid-state photo sensor device according to claim 1, wherein said first amorphous silicon layer is an n-type layer whose impurity concentration is at most about 0.1 molPPM of trivalent impurity atoms, said first amorphous silicon layer having a thickness of about 50 to 1,000 Å.

17. The solid-state photo sensor device according to claim 16, wherein said second amorphous silicon layer contains trivalent impurity atoms whose concentration is about 0.1 to 200 molPPM, said second amorphous silicon layer having a thickness of about 0.1 to 5 μm.

18. The solid-state photo sensor device according to claim 1, wherein said first amorphous silicon layer is an n-type layer whose impurity concentration is at most about 0 to 200 molPPM of hexavalent impurity atoms, said n-type layer having a thickness of about 50 to 1,000 Å.

19. The solid-state photo sensor device according to claim 18, wherein said second amorphous silicon layer contains trivalent impurity atoms whose concentration is about 0.1 to 200 molPPM, said second amorphous layer having a thickness of about 0.1 to 5 μm.

* * * * *